United States Patent
Sun (10) Patent No.: US 8,723,613 B2
(45) Date of Patent: May 13, 2014

(54) WIDEBAND PHASE MODULATOR

(75) Inventor: Bo Sun, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/215,676

(22) Filed: Aug. 23, 2011

(65) Prior Publication Data

US 2011/0304368 A1 Dec. 15, 2011

Related U.S. Application Data

(63) Continuation of application No. 12/402,441, filed on Mar. 11, 2009, now Pat. No. 8,044,742.

(51) Int. Cl.
*H04L 27/20* (2006.01)
*H03C 3/00* (2006.01)

(52) U.S. Cl.
CPC .......... *H04L 27/2032* (2013.01); *H04L 27/205* (2013.01); *H03C 3/00* (2013.01)
USPC ........... 332/103; 332/104; 332/144; 375/302; 375/308

(58) Field of Classification Search
USPC ............... 332/103, 117, 119, 120, 144, 145; 375/302, 308, 376; 455/110
See application file for complete search history.

(56) References Cited

U.S. PATENT DOCUMENTS

| | | | |
|---|---|---|---|
| 4,720,685 A | 1/1988 | Garuts | |
| 5,491,673 A | 2/1996 | Okayasu | |
| 5,701,594 A | 12/1997 | Bath et al. | |
| 5,907,253 A | 5/1999 | Davis et al. | |
| 5,929,682 A | 7/1999 | Kazuya et al. | |
| 5,937,339 A | 8/1999 | Vigne | |
| 6,160,856 A * | 12/2000 | Gershon | 375/320 |
| 6,185,411 B1 | 2/2001 | Gillig et al. | |
| 6,563,387 B2 | 5/2003 | Hirano et al. | |
| 6,788,668 B1 | 9/2004 | Shah et al. | |
| 6,826,247 B1 | 11/2004 | Elliott et al. | |
| 7,260,375 B2 | 8/2007 | Ash | |
| 7,274,231 B1 | 9/2007 | Gillespie et al. | |
| 7,482,885 B2 | 1/2009 | Sridharan | |
| 7,483,508 B2 | 1/2009 | Staszewski et al. | |
| 7,505,737 B2 | 3/2009 | Park | |

(Continued)

FOREIGN PATENT DOCUMENTS

| | | |
|---|---|---|
| CN | 1600009 A | 3/2005 |
| EP | 0180450 A2 | 5/1986 |

(Continued)

OTHER PUBLICATIONS

Balabanian, et al., "Digital Logic Design Principles", John Wiley & Sons Publishing, 2001, ISBN 0-471-29351-2, pp. 142-145.*

(Continued)

*Primary Examiner* — Ryan Johnson
(74) *Attorney, Agent, or Firm* — Paul S. Holdaway (57) ABSTRACT

An apparatus for phase modulation includes a delay locked loop configured to generate from a reference signal a plurality of phase shifted signals, each of the phase shifted signals being locked to the reference signal and having a different phase shift from the other phase shifted signals with respect to the reference signal, and a multiplexer configured to select one of the phase shifted signals.

18 Claims, 6 Drawing Sheets

(56) References Cited

U.S. PATENT DOCUMENTS

| | | |
|---|---|---|
| 7,609,199 B2 | 10/2009 | Nishijima et al. |
| 7,613,267 B2 | 11/2009 | Perrott et al. |
| 7,729,440 B2 | 6/2010 | Dussarat et al. |
| 7,817,768 B2 | 10/2010 | Beyer et al. |
| 7,885,369 B2 | 2/2011 | Beyer et al. |
| 8,044,742 B2 | 10/2011 | Sun |
| 2003/0016762 A1 | 1/2003 | Martin et al. |
| 2003/0058053 A1 | 3/2003 | Jeon et al. |
| 2003/0067359 A1 | 4/2003 | Darabi et al. |
| 2003/0092419 A1 | 5/2003 | Nobbe et al. |
| 2003/0099321 A1* | 5/2003 | Juan et al. ............... 375/376 |
| 2005/0153669 A1 | 7/2005 | Suzuki et al. |
| 2005/0280473 A1 | 12/2005 | Puma et al. |
| 2006/0066368 A1 | 3/2006 | Gabato, Jr. et al. |
| 2006/0198426 A1 | 9/2006 | Partyka |
| 2007/0015471 A1 | 1/2007 | Cook et al. |
| 2007/0049330 A1 | 3/2007 | Kim et al. |
| 2007/0164835 A1* | 7/2007 | Co ........................ 332/144 |
| 2007/0242026 A1 | 10/2007 | Julian et al. |
| 2007/0291875 A1* | 12/2007 | Lee et al. ............... 375/308 |
| 2008/0003954 A1 | 1/2008 | Matsuno |
| 2008/0037662 A1 | 2/2008 | Ravi et al. |
| 2008/0042706 A1 | 2/2008 | Yang et al. |
| 2008/0129386 A1 | 6/2008 | Zipper |
| 2008/0191750 A1 | 8/2008 | Wang |
| 2009/0163166 A1 | 6/2009 | Lin |
| 2009/0168942 A1 | 7/2009 | Choi et al. |
| 2009/0190694 A1 | 7/2009 | Kobayashi |
| 2010/0136937 A1 | 6/2010 | Shute et al. |
| 2010/0207693 A1 | 8/2010 | Fagg |
| 2011/0143689 A1 | 6/2011 | Ballantyne et al. |
| 2011/0275313 A1 | 11/2011 | Baldemair et al. |
| 2012/0139592 A1 | 6/2012 | Bo et al. |
| 2013/0287065 A1 | 10/2013 | SUN; Bo et al. |

FOREIGN PATENT DOCUMENTS

| | | |
|---|---|---|
| EP | 0357527 A2 | 3/1990 |
| JP | S6359216 A | 3/1988 |
| JP | 9261048 A | 10/1997 |
| JP | H10112669 A | 4/1998 |
| JP | 10304000 A | 11/1998 |
| JP | 2004527953 A | 9/2004 |
| JP | 2004289355 A | 10/2004 |
| JP | 2005033234 A | 2/2005 |
| JP | 2005203960 A | 7/2005 |
| JP | 2008136031 A | 6/2008 |
| JP | 4310476 B2 | 8/2009 |
| JP | 2009303212 A | 12/2009 |
| KR | 20090079110 A | 7/2009 |
| TW | 387130 B | 4/2000 |
| TW | 200718024 | 5/2007 |
| WO | WO9938252 A1 | 7/1999 |
| WO | 02080484 A1 | 10/2002 |
| WO | 2007046061 A2 | 4/2007 |

OTHER PUBLICATIONS

International Search Report and Written Opinion—PCT/US2010/026941, International Search Authority—European Patent Office—Mar. 22, 2011.

Su P. E., et al., "A 2.4 GHz Wideband Open-Loop GFSK Transmitter With Phase Quantization Noise Cancellation", IEEE Journal of Solid-State Circuits, vol. 46, No. 3, Mar. 2011, pp. 615-626.

Philippe, P.; , "A zero crossing avoidance predistortion technique for polar transmitters," Electronics, Circuits and Systems, 2008. ICECS 2008. 15th IEEE International Conference on , v pp. 814-817, Aug. 31, 2008-Sep. 3, 2008.

Wang, et al., "Vector Hole Punching Technique for OFDM Signals Using Circle-Tangent Shift and Unused Tones," IEEE Transactions on Microwave Theory and Techniques, vol. 57, No. 11, pp. 2682-2691, Nov. 2009.

Youssef, et al., "A low-power wideband polar transmitter for 3G applications," Solid-State Circuits Conference Digest of Technical Papers (ISSCC), 2011 IEEE International , pp. 378-380, Feb. 20-24, 2011.

Arias, et al., "Nonlinearity Correction for Multibit ? ? DACs," IEEE Transactions on Circuits and Systems- I, Regular Papers, vol. 52, No. 6, Jun. 2005, pp. 1033-1041.

Nagaraj, et al., "A Self-Calibrating Sub-Picosecond Resolution Digital-to-Time Converter," Microwave Symposium, 2007. IEEE/MTT-S International, Jun. 3-8, 2007, pp. 2201-2204.

Taiwan Search Report—TW099107119—TIPO—Nov. 22, 2012.

\* cited by examiner

WIDEBAND PHASE MODULATOR

BACKGROUND

1. Field

The present application for patent is a Continuation of U.S. patent application Ser. No. 12/402,441 entitled "WIDEBAND PHASE MODULATOR" filed Mar. 11, 2009, pending, and assigned to the assignee hereof and hereby expressly incorporated by reference herein.

2. Background

Modern telecommunication systems are designed to allow a transmitter to communicate with a receiver over a transmission medium by modulating a carrier signal. Numerous modulation techniques are known in the art, such as amplitude modulation, frequency modulation, and phase modulation. These modulation schemes may be used to convey information by varying some aspect of a carrier signal.

A constellation diagram is commonly used to represent a carrier signal modulated with digital information. The constellation diagram is a two-dimensional scatter diagram of constellation points in the complex plane, with each constellation point representing a modulation symbol. Each modulation symbol in the constellation diagram has a real and imaginary component. The real component is referred to as the in-phase (I) component and the imaginary component is referred to as the quadrature phase (Q) component. By modulating a cosine carrier with the I component of the modulation symbol and a sine carrier with the Q component of the modulation symbol, the symbol can be transmitted with two carrier signals at the same frequency, which can be independently demodulated at the receiver. The concept of using two independently modulated signal carriers is known as quadrature modulation.

Another common modulation technique is known as polar modulation. In contrast to quadrature modulation, which represents each modulation symbol in the constellation diagram by its I and Q components, polar modulation represents each symbol by its polar coordinates. More precisely, each modulation symbol in the constellation diagram can be represented by two polar components: the radial component and the angular component. The radial component is used to modulate the amplitude of the carrier signal and the angular component is used to modulate the phase.

In polar modulation systems, a phase locked loop (PLL) is commonly employed to modulate the phase of the carrier signal. Unfortunately, the PLL is limited to narrowband applications. With the recent emergence of wideband technologies to support short range communications in dense multipath environments, PLLs may no longer be a viable option. Accordingly, there is a need in the art for improved methods to modulate the phase of a carrier signal for wideband applications.

SUMMARY

In one aspect of the disclosure, an apparatus for phase modulation includes a delay locked loop configured to generate a plurality of phase shifted signals from a reference signal, each of the phase shifted signals being locked to the reference signal and having a different phase shift from the other phase shifted signals with respect to the reference signal, and a multiplexer configured to select one of the phase shifted signals.

In another aspect of the disclosure, an apparatus for phase modulation includes means for generating a plurality of phase shifted signals from a reference signal, each of the phase shifted signals being locked to the reference signal and having a different phase shift from the other phase shifted signals with respect to the reference signal, and means for selecting one of the phase shifted signals.

In yet another aspect of the disclosure, a method for phase modulation signal includes generating a plurality of phase shifted signals from a reference signal, each of the phase shifted signals being locked to the reference signal and having a different phase shift from the other phase shifted signals with respect to the reference signal, and selecting one of the phase shifted signals.

In a further aspect of the disclosure, a computer-program product for phase modulation includes computer-readable medium comprising codes executable by at least one processor to generate a plurality of phase shifted signals from a reference signal, each of the phase shifted signals being locked to the reference signal and having a different phase shift from the other phase shifted signals with respect to the reference signal, and select one of the phase shifted signals.

In yet a further aspect of the disclosure, a headset includes a transducer configured to produce an output, a delay locked loop configured to generate a plurality of phase shifted signals from a reference signal, each of the phase shifted signals being locked to the reference signal and having a different phase shift from the other phase shifted signals with respect to the reference signal, and a multiplexer configured to select one of the phase shifted signals in response to the transducer output.

In yet another aspect of the disclosure, a watch includes a user interface configured to produce an output, a delay locked loop configured to generate a plurality of phase shifted signals from a reference signal, each of the phase shifted signals being locked to the reference signal and having a different phase shift from the other phase shifted signals with respect to the reference signal, and a multiplexer configured to select one of the phase shifted signals based on the user interface output.

In yet a further aspect of the disclosure, a sensing device includes a sensor configured to produce an output, a delay locked loop configured to generate a plurality of phase shifted signals from a reference signal, each of the phase shifted signals being locked to the reference signal and having a different phase shift from the other phase shifted signals with respect to the reference signal, and a multiplexer configured to select one of the phase shifted signals based on the sensor output.

It is understood that other aspects of the disclosure will become readily apparent to those skilled in the art from the following detailed description, wherein various aspects of a wideband modulator are shown and described by way of illustration. As will be realized, these aspects of the disclosure may be implemented in other and different configurations and its several details are capable of modification in various other respects. Accordingly, the drawings and detailed description are to be regarded as illustrative in nature and not as restrictive.

In accordance with common practice, some of the drawings may be simplified for clarity. Thus, the drawings may not depict all of the components of a given apparatus or method.

DETAILED DESCRIPTION

Various aspects of the invention are described more fully hereinafter with reference to the accompanying drawings. This invention may, however, be embodied in many different forms and should not be construed as limited to any specific structure or function presented throughout this disclosure. Rather, these aspects are provided so that this disclosure will be thorough and complete, and will fully convey the scope of the invention to those skilled in the art. Based on the teachings herein one skilled in the art should appreciate that the scope of the invention is intended to cover any aspect of the invention disclosed herein, whether implemented independently of or combined with any other aspect of the invention. For example, an apparatus may be implemented or a method may be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect of the invention disclosed herein may be embodied by one or more elements of a claim.

Several aspects of a wideband modulator will now be presented. These aspects will be presented with reference to a wireless node for wideband communications. The wireless node includes a transceiver to communicate with another node using polar modulation. The polar modulation scheme may be implemented with a wideband modulator that includes a delay locked loop and a multiplexer. The delay locked loop may be used to generate a series of phase shifted signals locked to a reference signal. The multiplexer may be used to select one of the phase shifted signal based on the angular component of the modulation symbol to be transmitted.

Figure 1:
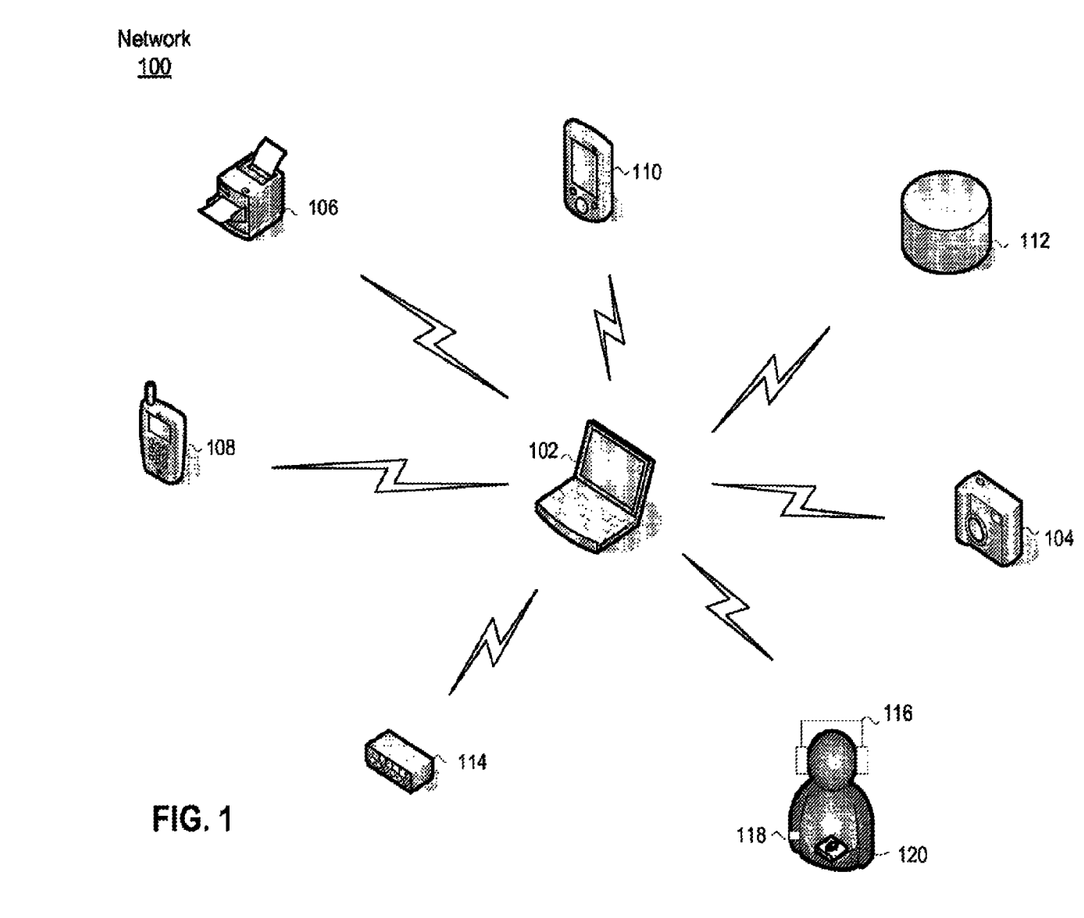
FIG. 1 is a conceptual diagram illustrating an example of a wireless network.

An example of a short range communications network suitable for a wireless node employing a wideband modulator is illustrated in FIG. 1. The network 100 is shown with various wireless nodes that communicate using any suitable radio technology or wireless protocol. By way of example, the wireless nodes may be configured to support Ultra-Wideband (UWB) technology. UWB is a common technology for high speed short range communications and is defined as any radio technology having a spectrum that occupies a bandwidth greater than 20 percent of the center frequency, or a bandwidth of at least 500 MHz. Alternatively, the wireless nodes may be configured to support various wireless protocols such as Bluetooth or IEEE 802.11, just to name a few.

The network 100 is shown with a computer 102 in communication with the other wireless nodes. In this example, the computer 102 may receive digital photos from a digital camera 104, send documents to a printer 106 for printing, synch-up with e-mail on a personal digital assistant (PDA) 108, transfer music files to a digital audio player (e.g., MP3 player) 110, back up data and files to a mobile storage device 112, and communicate with a remote network (e.g., the Internet) via a wireless hub 114. The network 100 may also include a number of mobile and compact nodes, either wearable or implanted into the human body. By way of example, a person may be wearing a headset 116 (e.g., headphones) that transmits audio from a transducer to the computer 102, a watch 118 that transmits time or other information from a user interface to the computer 102, and/or a sensor 120 which monitors vital body parameters (e.g., a biometric sensor, a heart rate monitor, a pedometer, and EKG device, etc.). The sensor 120 transmits information from the body of the person to the computer 102 where the information may be forwarded to a medical facility (e.g., hospital, clinic, etc) via the wireless hub 114.

Although well suited for this application, the wideband modulator presented throughout this disclosure, or any aspect thereof, may be extended to other applications. By way of example, the wideband modulator may be implemented in any wireless node operating a wide area network supporting any suitable wireless protocol, such as Evolution-Data Optimized (EV-DO), Ultra Mobile Broadband (UMB), Code Division Multiple Access (CDMA) 2000, Long Term Evolution (LTE), Wideband CDMA (W-CDMA), or the like. The wideband modulator may also be implemented in any node configured to support wired communications using cable modem, Digital Subscriber Line (DSL), fiber optics, Ethernet, HomeRF, or any other suitable wired access protocol. As those skilled in the art will readily appreciate from the teachings presented throughout this disclosure, various aspects of the wideband modulator may be used for other functions, including by way of example, clock generation, clock distribution, clock multiplication, cluck division, clock recovery, deskewing, or any other suitable function.

Figure 2:
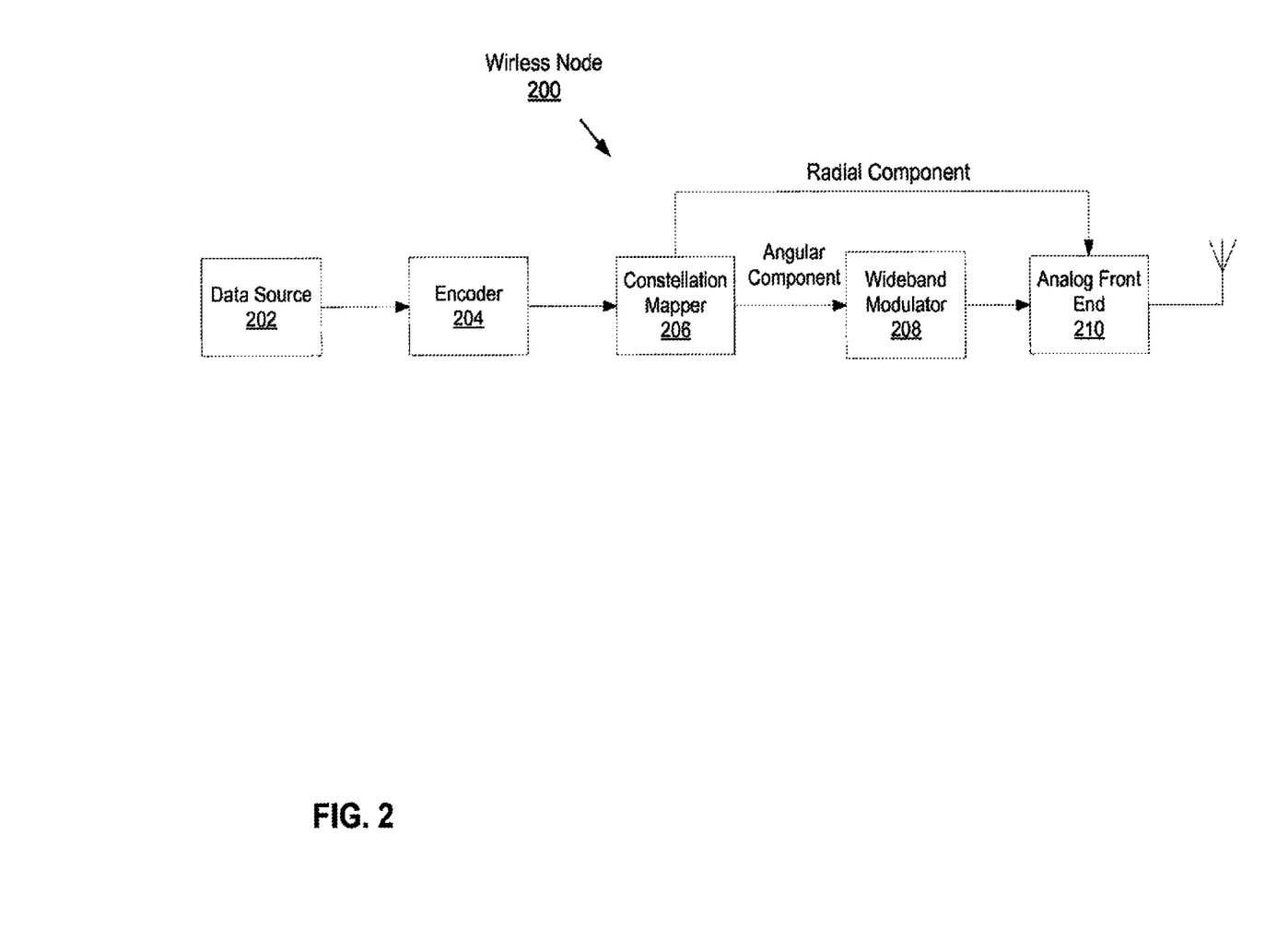
FIG. 2 is a conceptual diagram illustrating an example of a wireless node.

FIG. 2 is a conceptual block diagram illustrating an example of a wireless node with a wideband modulator. The wireless node 200 is shown as a transmitter, but may also be capable of receiving. Such a node would require a receiver, which may be a separate component or integrated with the transmitter into a single component known as a "transceiver." As those skilled in the art will readily appreciate, the various aspects of a wideband modulator presented throughout this disclosure are applicable to any suitable transmitter function, regardless of whether the transmitter is a stand-alone component, integrated into a transceiver, or part of a node in a telecommunications system.

The wireless node 200 may be configured to implement the protocol stack for the transmission medium. The protocol stack includes a physical layer implemented with an encoder 204, a constellation mapper 206, a wideband modulator 208, and an analog front end (AFE) 210. A data source 202 represents conceptually all the protocol layers above the physical layer. By way of example, the data source 202 may represent various applications that provide speech and multimedia codecs, graphics processing, and/or other data processing functions to produce a stream of data packets. Each data packet may be appended with information as it passed down through the various protocol layers (e.g., transport layer, network layer, MAC layer) to the physical layer.

The physical layer provides various signal processing functions for the data packets. In the example shown in FIG. 2, each data packet is provided to the encoder 204. The encoder 204 may be used to provide Reed-Solomon (RS) and convolutional encoding or some other encoding scheme. RS and convolutional encoding add redundant information to the data packet. This redundancy may be used by the receiving node to correct errors in the transmission due to disturbances in the transmission medium. The encoded data bits in the data packet are then blocked together and mapped to points on a constellation by the constellation mapper 206 to produce a stream of modulation symbols. The phase information for each modulation symbol, which in this case is the angular component, is provided to the wideband modulator 208 to modulate the phase of a carrier signal. The phase modulated carrier signal for each modulation symbol is then provided to the AFE 210 where the amplitude is modulated by the radial component for that modulation symbol with one or more variable gain amplifiers (not shown) or by some other suitable means. The AFE 210 also provides other signal conditioning functions (e.g., filtering) before providing the modulated carrier signal to the antenna for transmission.

Figure 3:
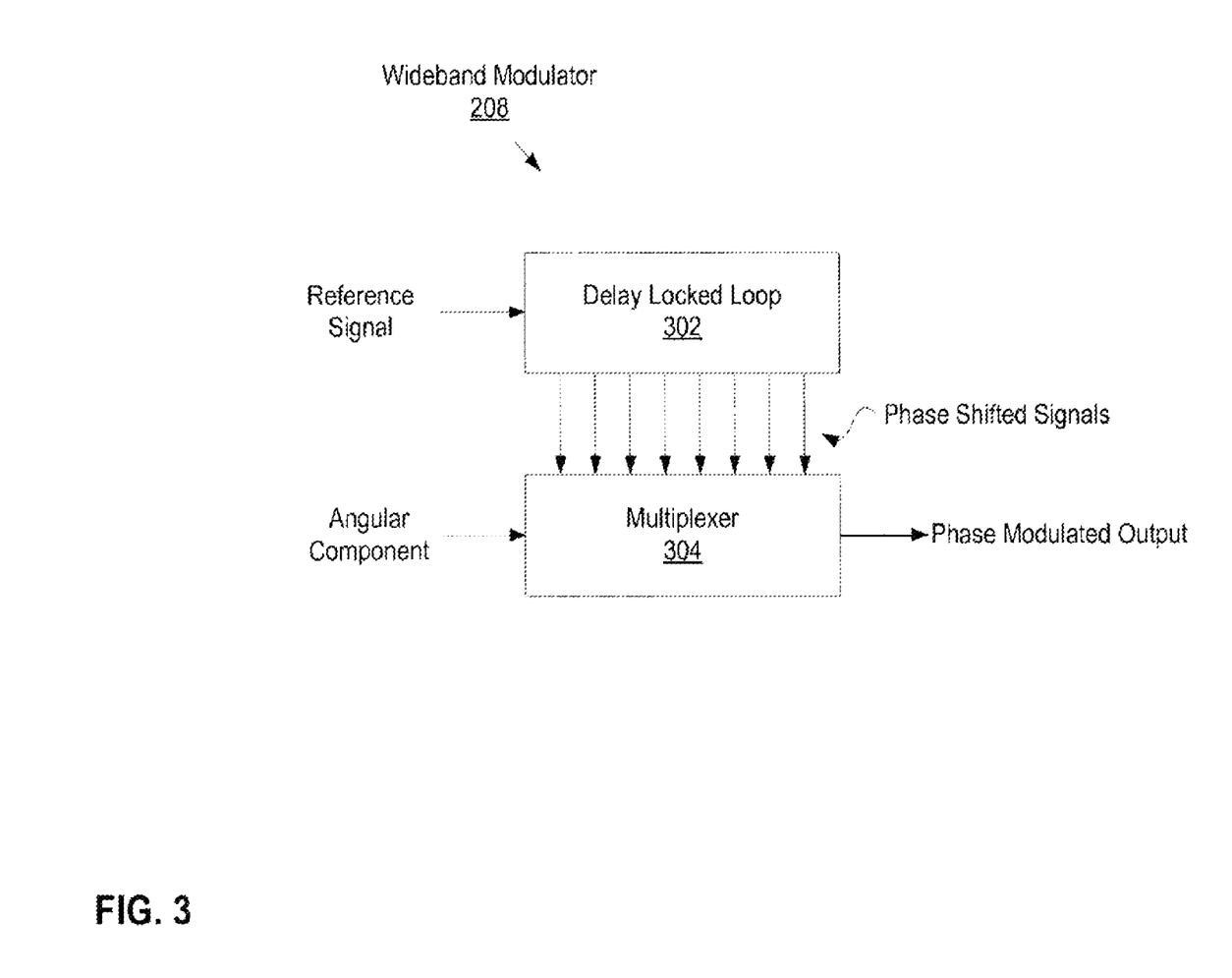
FIG. 3 is a conceptual diagram illustrating an example of a wideband modulator for use in a wireless node.

FIG. 3 is a conceptual diagram illustrating an example of a wideband modulator that may be used in the wireless node described above in connection with FIG. 2. The wideband modulator 208 may include a delay locked loop 302 which generates a series of phase shifted signals locked to a reference signal. The reference signal represents the carrier signal and each phase shifted signal represents the angular component of a point (i.e., modulation symbol) on the constellation diagram. The reference signal may be generated by a crystal oscillator (not shown) or by some other stable reference source. The crystal oscillator may be part of the wideband modulator 208 or provided elsewhere in the wireless node. The phase shifted signals from the delay locked loop 302 may be provided to a multiplexer 304. The multiplexer 304 selects one of the phase shifted signals based on the phase information, which in this case is angular component of the modulation symbol input to the wideband modulator 208.

Figure 4:
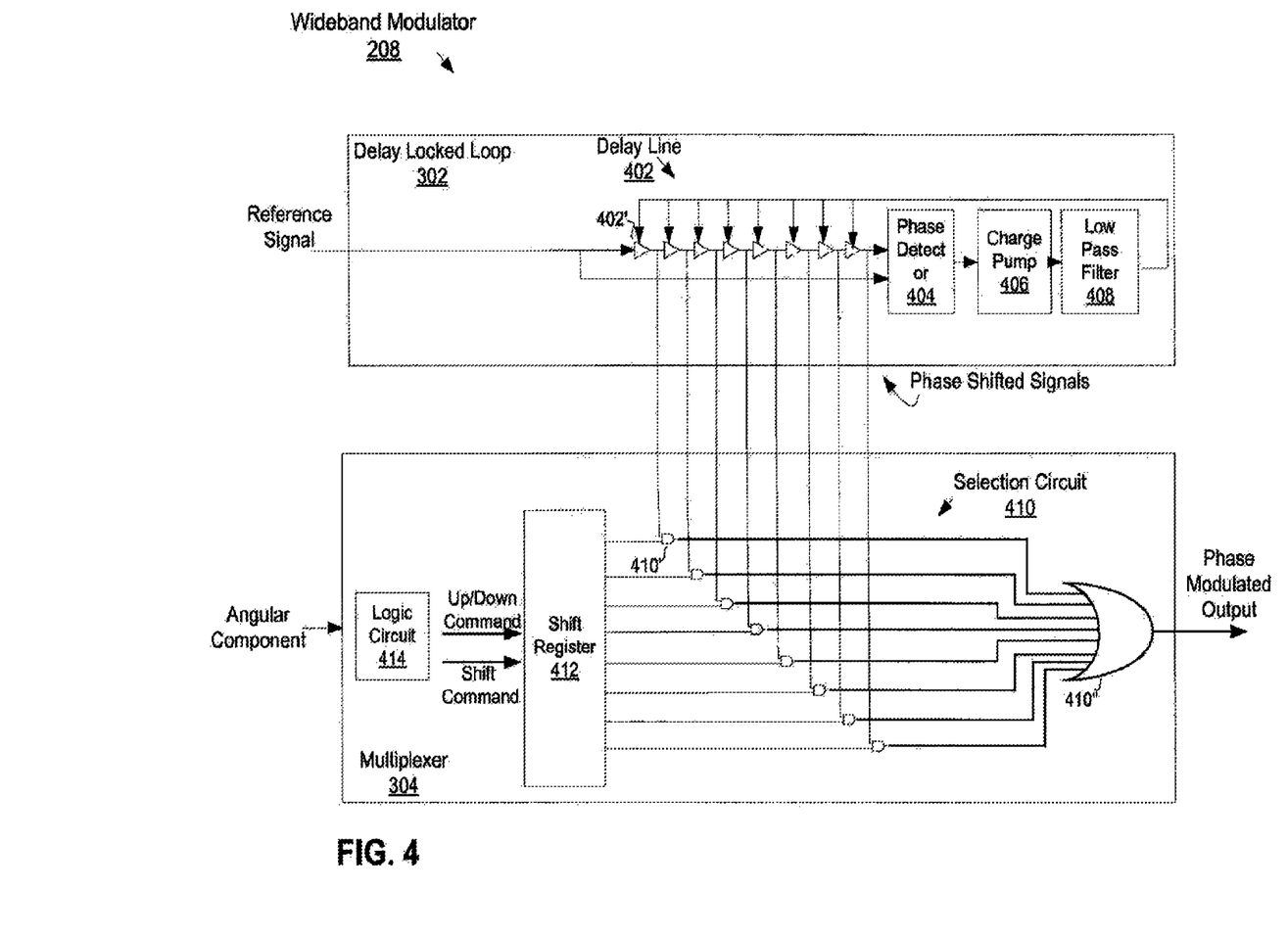
FIG. 4 is a conceptual diagram illustrating a more detailed example of a wideband modulator for use in a wireless node.

FIG. 4 is a conceptual diagram illustrating a more detailed example of the wideband modulator. The delay locked loop 302 includes a delay line 402 with a number of variable delay elements 402' connected together in series to delay the reference signal by one period or cycle. The one period delay is maintained by a phase detector 404, a charge pump 406, and a low-pass filter 408 arranged in a negative feedback closed-loop configuration. The phase detector 404 is used to detect any phase error between the reference signal and the delayed reference signal output from the delay line 402. The phase detector 404 produces an error signal proportional to the phase error. The charge pump 406 is used to convert the error signal to the DC component that sets the delay for the variable delay elements 402' in the delay line 402. The low-pass filter 408 is used to control the dynamic characteristics of the delay locked loop by filtering out large error signals, thereby determining the capture range, lock time, and transient performance of the loop. The output from each of the variable delay elements 402' is provided to the multiplexer 304 as one of the phase shifted signals.

The multiplexer 304 includes a selection circuit 410 comprising a number of AND gates 410' feeding an OR gate 410". Each phase shifted signal from the delay locked loop 302 is provided to the input of an AND gate 410'. A shift register 412 is used to provide an enable bit (i.e., a logic level "1") to the AND gate 410' for the selected phase shifted signal and a disable bit (i.e., logic level "0") to the other AND 410' gates. The result is that only the selected phase shifted signal is provided to the input of the OR gate 410", which outputs the selected phase shifted signal from the wideband modulator. A logic circuit 414 is used to shift the enable bit through the shift register based on phase information, which in this case are the angular components of the modulation symbols received by the wideband modulator.

An example of a shift register that may be used in the multiplexer of the wideband modulator will now be presented. In this example, the shift register 412 is a bidirectional linear feedback shift register (LFSR), but may be configured differently depending on the particular application and overall design constraints. The bidirectional LFSR comprises a series of stages that have their inputs and outputs connected in such a way that the enable bit is shifted up or down in response to two commands from the logic circuit. The first command is an up/down command that determines the direction that the enable bit is shifted and the second command is a shift command that determines the number of stages to shift the enable bit in the direction required by the up/down command.

Figure 5:
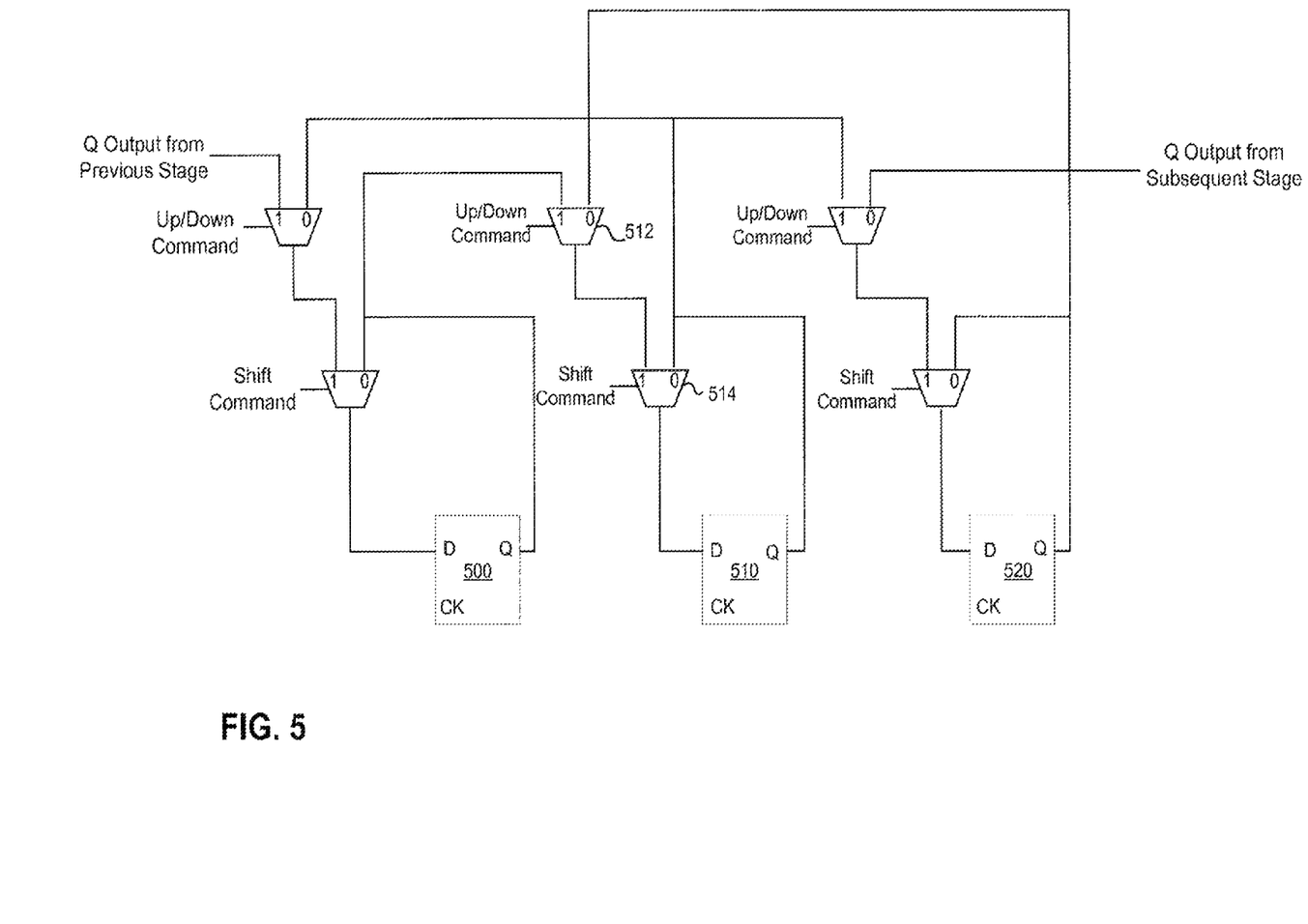
FIG. 5 is a conceptual block diagram illustrating an example of a shift register for use in a wideband modulator.

FIG. 5 is a conceptual diagram illustrating an example of the operation of the bidirectional LFSR. In this example, each stage of the bidirectional LFSR is implemented with a D flip-flop. For ease of explanation, the operation of a single D flip-flop stage 510 will be described with reference to a preceding D flip-flop stage 500 and a subsequent D flip-flop stage 520 in FIG. 5. The ability to shift the enable bit in either direction is provided by a first multiplexer 512, which is responsive to an up/down command from the logic circuit 414 (see FIG. 4). The first multiplexer 512 receives a first input from the Q output of the preceding D flip-flop stage 500, which is passed through the multiplexer 512 in response to a shift down command, and a second input from the Q output of the subsequent D flip-flop stage 520, which is passed through the multiplexer 512 in response to a shift up command.

A second multiplexer 514 provides the ability to shift the enable bit a designated number of stages based on the shift command from the logic circuit. The second multiplexer 514 has a first input coupled to the output of the first multiplexer 512 and a second input coupled to the Q output of the D flip-flop stage. The output of the second multiplexer 514 is coupled to the D-input of the flip-flop stage 510. With this configuration, the enable bit in the shift register is shifted through the stages as long as the shift command from the logic circuit is active. By way of example, the logic circuit will activate the shift command for three clock cycles to shift the enable bit three stages in either the up or down direction. The logic circuit will then inactivate the shift command, resulting in the Q output from the flip-flop stage 510 being fed back to the D-input every clock cycle.

The wideband modulator may be implemented as hardware, software, or combinations of both. To illustrate this interchangeability of hardware and software, the wideband modulator has been described above generally in terms of its functionality. Whether such functionality is implemented as hardware or software depends upon the particular application and design constraints imposed on the overall system. Skilled artisans may implement the described functionality in varying ways for each particular application.

As an example, the wideband modulator may be implemented with a digital signal processor (DSP) in an application specific circuit (AMC). Machine-readable media may be used to store software that implements the wideband modulator when executed by the DSP. The machine-readable media, either in whole or part, may be integrated into or external to the ASIC. As another example, the wideband modulator may be implemented by a microprocessor capable of accessing software stored on machine-readable media over a bus architecture. The software may implement the wideband modulator when executed by the microprocessor. Other software implementations of the wideband modulator on different hardware platforms will become readily apparent to those skilled in the art. Hardware implementations of the wideband modulator may include gated logic, discrete hardware components, or other dedicated hardware capable of performing the various functions described throughout this disclosure.

Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof.

The software supported by the machine-readable media may reside in a single storage device or distributed across multiple memory devices. By way of example, software may be loaded into RAM from a hard drive. During execution of the software, some of the instructions may be loaded from RAM to cache to increase access speed. One or more cache lines may then be loaded into a general register file for execution. When referring to the functionality of a software, it will be understood that such functionality is implemented by a hardware platform executing software instructions.

Figure 6:
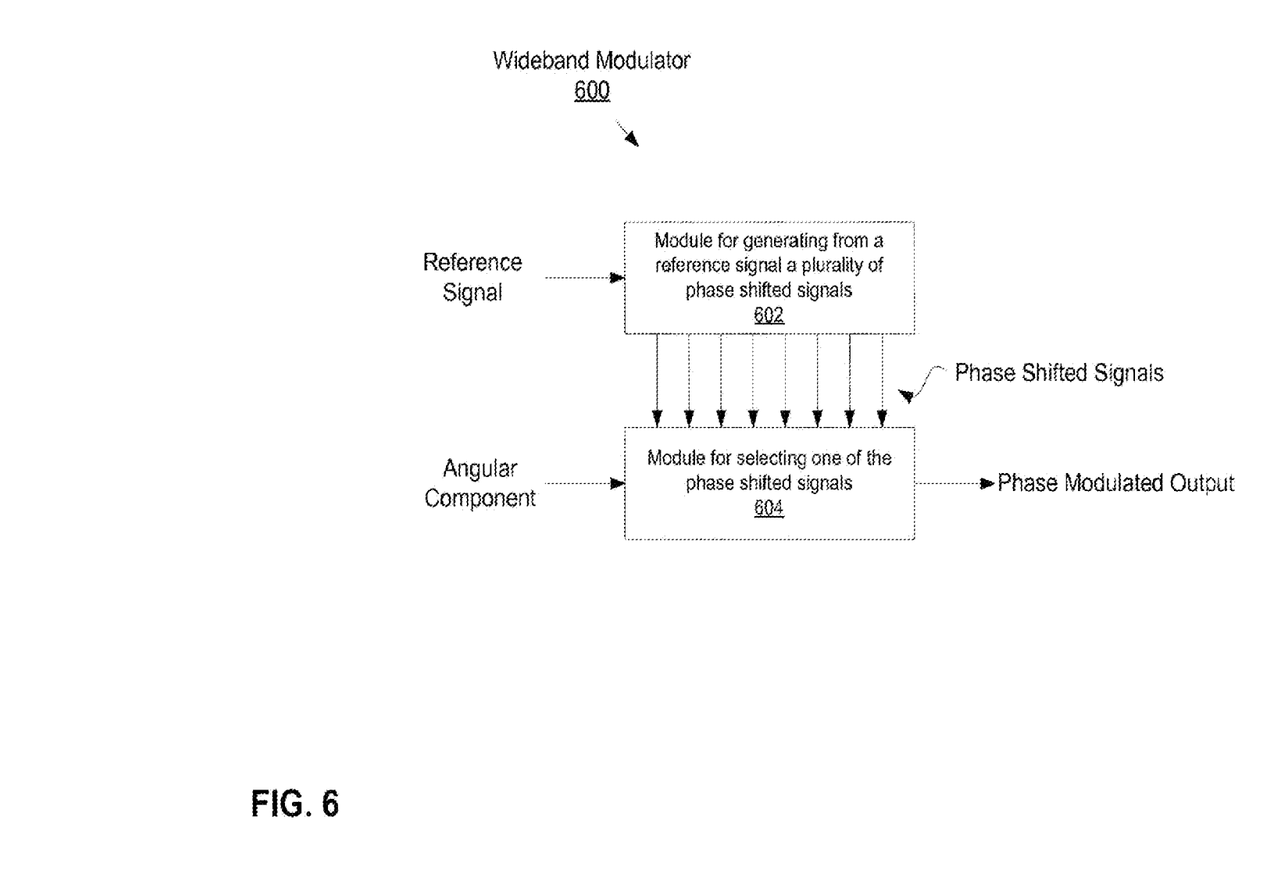
FIG. 6 is a conceptual block diagram illustrating the functionality of a wideband modulator for use in a wireless node.

FIG. 6 is a conceptual diagram illustrating an example of the functionality of a wideband modulator. In this example, the wideband modulator 600 includes a module 602 for generating from a reference signal a plurality of phase shifted signals, with each of the phase shifted signals being locked to the reference signal and having a different phase shift from the other phase shifted signals with respect to the reference signal. The wideband modulator 600 also includes a module 604 for selecting one of the phase shifted signals.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus for phase modulation, comprising:
a delay locked loop configured to generate a plurality of phase shifted signals from a reference signal, each of the phase shifted signals being locked to the reference signal and having a different phase shift from the other phase shifted signals with respect to the reference signal, wherein the reference signal is periodic, and wherein the delay locked loop comprises a delay line configured to receive the reference signal, the delay line having a delay substantially equal to the period of the reference signal; and
a selection circuit configured to output one of the phase shifted signals based on phase information, wherein the selection circuit comprises a logic circuit configured to generate a phase change direction command and a phase change magnitude command based on the phase information, wherein the selection circuit is configured to output the one of the phase shifted signals based on the phase change direction and phase change magnitude commands.

2. The apparatus of claim 1, wherein the selection circuit further comprises a shift register configured to generate a plurality of select signals based on the phase change direction command and the phase change magnitude command, wherein the selection circuit is configured to output the one of the phase shifted signals based on the plurality of select signals.

3. The apparatus of claim 1, further comprising a constellation mapper configured to generate the phase information from which the selection circuit is configured to output the one of the phase shifted signals.

4. The apparatus of claim 1 wherein the delay line comprises a plurality of delay elements connected in series, and wherein each of the phase shifted signals generated from the reference signal is provided to the selection circuit from respective outputs of the delay elements.

5. The apparatus of claim 1 wherein the delay line comprises a plurality of variable delay elements, the apparatus further comprising a phase detector configured to detect an error signal based on a difference between a phase of the reference signal and a phase of one of the phase shifted signals, wherein the delay of each of the delay elements is varied as a function of the error signal.

6. A method for phase modulation, comprising:
generating a plurality of phase shifted signals from a reference signal, wherein the phase shifted signals are locked to the reference signal, and further wherein the phase shifted signals have distinct phases with respect to the reference signal, wherein generating the plurality of select signals is based on received phase information, wherein the reference signal is periodic, and wherein the phase shifted signals are generated with a delay line configured to receive the reference signal, the delay line having a delay substantially equal to the period of the reference signal;
generating a phase change direction command based on received phase information;
generating a phase change magnitude command based on the received phase information; and
outputting a selected one of the phase shifted signals based on the phase change direction command and the phase change magnitude command.

7. An apparatus for phase modulation, comprising:
a delay locked loop configured to generate a plurality of phase shifted signals from a reference signal, each of the phase shifted signals being locked to the reference signal and having a different phase shift from the other phase shifted signals with respect to the reference signal; and
a multiplexer configured to select one of the phase shifted signals based on a phase change direction command and a phase change magnitude command.

8. The apparatus of claim 7, further comprising a logic circuit configured to generate the phase change direction command and the phase change magnitude command based on received phase information.

9. The apparatus of claim 7, further comprising a select circuit configured to generate a control signal based on the phase change direction command and the phase change magnitude command, said control signal being used by the multiplexer to select one of the phase shifted signals.

10. The apparatus of claim 9, wherein the select circuit comprises a shift register.

11. The apparatus of claim 9, wherein the select circuit comprises a linear feedback shift register (LFSR).

12. The apparatus of claim 11, wherein the linear feedback shift register (LFSR) is bidirectional.

13. A method for phase modulation, comprising:
generating a plurality of phase shifted signals from a reference signal, wherein the phase shifted signals are locked to the reference signal, and further wherein the phase shifted signals have distinct phases with respect to the reference signal; and
selecting one of the plurality of phase shifted signals based on a phase change direction command and a phase change magnitude command.

14. The method of claim 13, further comprising generating the phase change direction command and the phase change magnitude command based on received phase information.

15. An apparatus for phase modulation, comprising:
means for generating a plurality of phase shifted signals from a reference signal, each of the phase shifted signals being locked to the reference signal and having a different phase shift from the other phase shifted signals with respect to the reference signal, wherein the reference signal is periodic, and wherein the means for generating the plurality of phase shifted signals comprises means for sequentially delaying the reference signal to generate the plurality of phase shifted signals, the means for sequentially delaying having an aggregate delay equal to substantially a period of the reference signal; and
means for outputting one of the phase shifted signals based on received phase information, wherein the means for outputting the one of the phase shifted signals is configured to generate a phase change direction command and a phase change magnitude command based on the received phase information, and wherein the means for outputting the one of the phase shifted signals is configured to output the one of the phase shifted signals based on the phase change direction and phase change magnitude commands.

16. A non-transitory computer readable medium encoded with codes executable by at least one processor to:
generate a plurality of phase shifted signals from a reference signal, wherein the phase shifted signals are locked to the reference signal, and further wherein the phase shifted signals have distinct phases with respect to the reference signal, wherein the reference signal is periodic, and wherein the phase shifted signals are generated with a delay line configured to receive the reference signal, the delay line having a delay substantially equal to the period of the reference signal;
generate a phase change direction command based on received phase information;
generate a phase change magnitude command based on the received phase information; and
output one of the phase shifted signals based on the phase change direction command and the phase change magnitude command.

17. An apparatus for phase modulation, comprising:
means for generating a plurality of phase shifted signals from a reference signal, each of the phase shifted signals being locked to the reference signal and having a different phase shift from the other phase shifted signals with respect to the reference signal; and
means for selecting one of the phase shifted signals based on a phase change direction command and a phase change magnitude command.

18. A non-transitory computer readable medium encoded with codes executable by at least one processor to:
generate a plurality of phase shifted signals from a reference signal, wherein the phase shifted signals are locked to the reference signal, and further wherein the phase shifted signals have distinct phases with respect to the reference signal; and
select one of the plurality of phase shifted signals based on a phase change direction command and a phase change magnitude command.

* * * * *